(12) United States Patent
De Klerk

(10) Patent No.: US 8,068,210 B2
(45) Date of Patent: *Nov. 29, 2011

(54) LITHOGRAPHIC APPARATUS, DEVICE MANUFACTURING METHOD AND COMPUTER PROGRAM PRODUCT

(75) Inventor: Johannes Wilhelmus De Klerk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 620 days.

This patent is subject to a terminal disclaimer.

(21) Appl. No.: 12/076,306

(22) Filed: Mar. 17, 2008

(65) Prior Publication Data

US 2008/0165340 A1   Jul. 10, 2008

Related U.S. Application Data

(63) Continuation of application No. 10/951,028, filed on Sep. 28, 2004, now Pat. No. 7,355,674.

(51) Int. Cl.
*G03B 27/42* (2006.01)
*G03B 27/58* (2006.01)

(52) U.S. Cl. .......................... 355/53; 355/72

(58) Field of Classification Search .......... 355/30, 355/53, 72–76; 248/638
See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,610,683 A | 3/1997 | Takahashi | |
| 5,715,039 A | 2/1998 | Fukuda et al. | |
| 5,825,043 A * | 10/1998 | Suwa | 250/548 |
| 5,900,354 A | 5/1999 | Batchelder | |
| 6,191,429 B1 | 2/2001 | Suwa | |
| 6,236,634 B1 | 5/2001 | Lee et al. | 369/112 |
| 6,327,024 B1 * | 12/2001 | Hayashi et al. | 355/53 |
| 6,490,025 B1 | 12/2002 | Makinouchi et al. | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,881,963 B2 * | 4/2005 | Ito | 250/491.1 |
| 7,063,192 B2 | 6/2006 | Mayama | |

(Continued)

FOREIGN PATENT DOCUMENTS

DE           206 607           2/1984

(Continued)

OTHER PUBLICATIONS

M. Switkes et al., "Immersion Lithography at 157 nm", MIT Lincoln Lab, Orlando Jan. 2001, Dec. 17, 2001.

(Continued)

*Primary Examiner* — Hung Henry Nguyen

(74) *Attorney, Agent, or Firm* — Pillsbury Winthrop Shaw Pittman LLP

(57) ABSTRACT

Additional vibrations are added during the exposure of a substrate so that vibrations occurring during exposure of a plurality of areas on the substrate are substantially uniform. This may improve CD uniformity.

23 Claims, 4 Drawing Sheets

U.S. PATENT DOCUMENTS

| | | | |
|---|---|---|---|
| 7,355,674 B2 * | 4/2008 | De Klerk | 355/53 |
| 2002/0020821 A1 | 2/2002 | Van Santen et al. | 250/492 |
| 2002/0163629 A1 | 11/2002 | Switkes et al. | |
| 2003/0123040 A1 | 7/2003 | Almogy | |
| 2003/0146554 A1 * | 8/2003 | Kato | 267/136 |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0119954 A1 | 6/2004 | Kawashima et al. | |
| 2004/0125351 A1 | 7/2004 | Krautschik | |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2005/0094116 A1 | 5/2005 | Flagello et al. | |
| 2005/0110973 A1 | 5/2005 | Streefkerk et al. | |
| 2005/0132914 A1 | 6/2005 | Mulkens et al. | |
| 2005/0134815 A1 | 6/2005 | Van Santen et al. | |
| 2005/0219481 A1 | 10/2005 | Cox et al. | |

FOREIGN PATENT DOCUMENTS

| | | | |
|---|---|---|---|
| DE | 221 563 | | 4/1985 |
| DE | 224448 | | 7/1985 |
| DE | 242880 | | 2/1987 |
| EP | 0023231 | | 2/1981 |
| EP | 0342040 | | 11/1989 |
| EP | 0418427 | | 3/1991 |
| EP | 1039511 | | 9/2000 |
| FR | 2474708 | | 7/1981 |
| JP | 58-202448 | | 11/1983 |
| JP | 62-065326 | | 3/1987 |
| JP | 62-121417 | | 6/1987 |
| JP | 63-157419 | | 6/1988 |
| JP | 401284793 | A | 11/1989 |
| JP | 04-305915 | | 10/1992 |
| JP | 04-305917 | | 10/1992 |
| JP | 06-124873 | | 5/1994 |
| JP | 07-132262 | | 5/1995 |
| JP | 07-220990 | | 8/1995 |
| JP | 09-219361 | * | 8/1997 |
| JP | 409219361 | A | 8/1997 |
| JP | 10-228661 | | 8/1998 |
| JP | 10-255319 | | 9/1998 |
| JP | 10-303114 | | 11/1998 |
| JP | 10-340846 | | 12/1998 |
| JP | 11-176727 | | 7/1999 |
| JP | 2000-058436 | | 2/2000 |
| JP | 2001-091849 | | 4/2001 |
| JP | 2004-193252 | | 7/2004 |
| WO | WO 99/49504 | | 9/1999 |
| WO | WO 03/077036 | | 9/2003 |
| WO | WO 03/077037 | | 9/2003 |
| WO | WO 2004/019128 | | 3/2004 |
| WO | WO 2004/053596 A2 | | 6/2004 |
| WO | WO 2004/053950 A1 | | 6/2004 |
| WO | WO 2004/053951 A1 | | 6/2004 |
| WO | WO 2004/053952 A1 | | 6/2004 |
| WO | WO 2004/053953 A1 | | 6/2004 |
| WO | WO 2004/053954 A1 | | 6/2004 |
| WO | WO 2004/053955 A1 | | 6/2004 |
| WO | WO 2004/053956 A1 | | 6/2004 |
| WO | WO 2004/053957 A1 | | 6/2004 |
| WO | WO 2004/053958 A1 | | 6/2004 |
| WO | WO 2004/053959 A1 | | 6/2004 |
| WO | WO 2004/055803 A1 | | 7/2004 |
| WO | WO 2004/057589 A1 | | 7/2004 |
| WO | WO 2004/057590 A1 | | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "⅛ μm Optical Lithography", J. Vac. Sci. Technol. B., vol. 10, No. 6, Nov./Dec. 1992, pp. 3032-3036.

H. Hogan, "New Semiconductor Lithography Makes a Splash", PHOTONICS SPECTRA, Photonics TechnologyWorld, Oct. 2003 Edition, pp. 1-3.

S. Owa and N. Nagasaka, "Potential Performance and Feasability of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

* cited by examiner

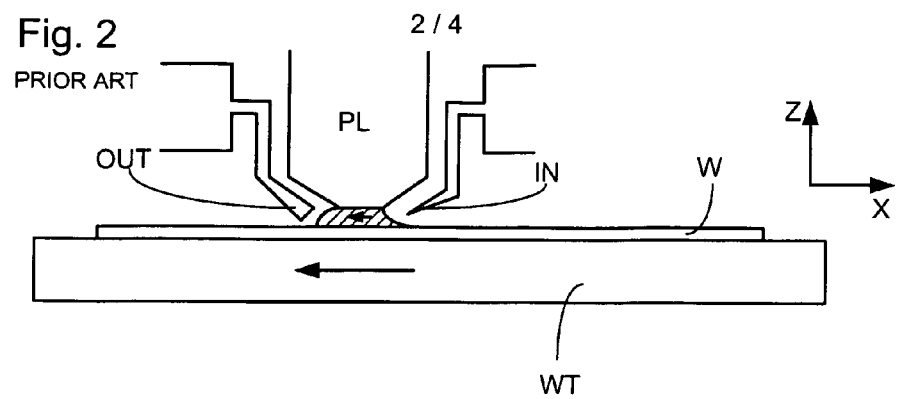
Fig. 2 PRIOR ART
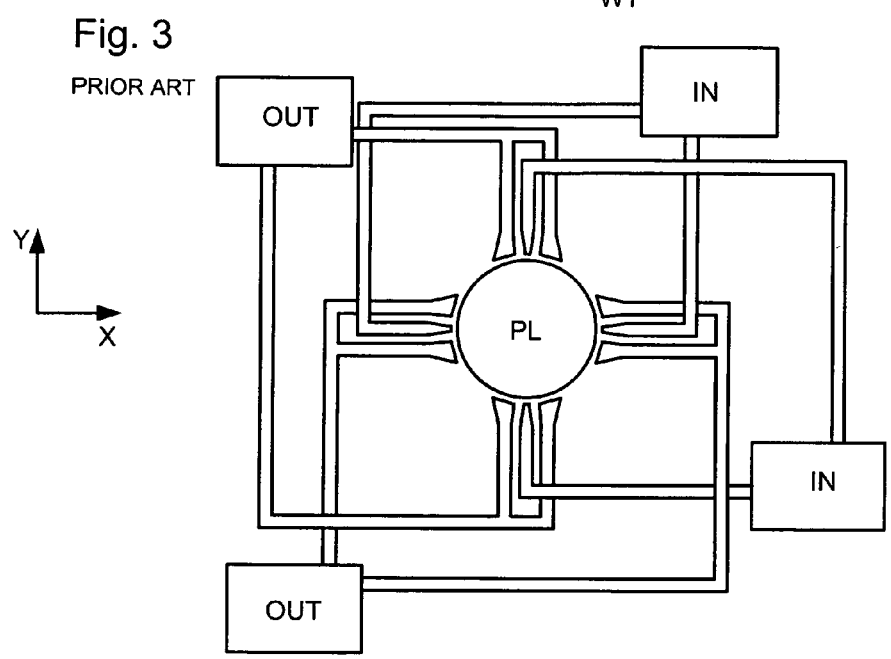
Fig. 3 PRIOR ART
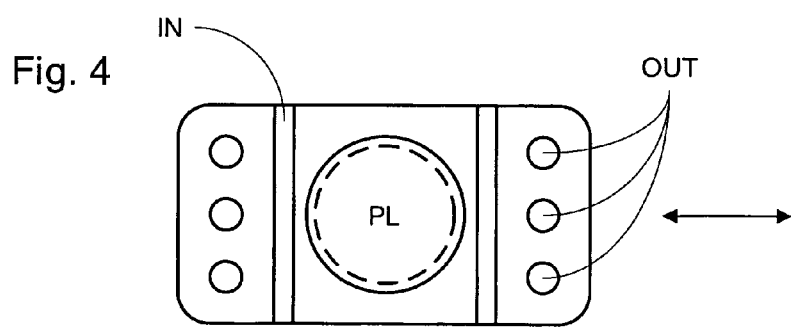
Fig. 4
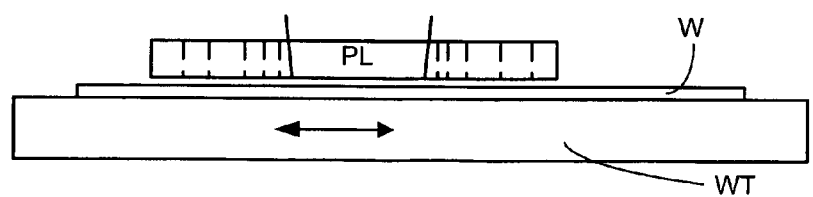

LITHOGRAPHIC APPARATUS, DEVICE MANUFACTURING METHOD AND COMPUTER PROGRAM PRODUCT

RELATED APPLICATIONS

This is a continuation application of U.S. patent application Ser. No. 10/951,028, filed Sep. 28, 2004, now U.S. Pat. No. 7,355,674, the entire contents of that application is hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In an immersion lithographic apparatus, the presence of the immersion liquid, and the arrangements to confine it, tend to damp vibrations in and of the substrate table, which is generally advantageous. However, there may remain significant vibrations when certain parts of the substrate are being exposed. For example, there may often be greater vibrations when edge target portions (dies) are being exposed due to the greater height variations in this part of the substrate necessitating a larger number of vertical movements of the substrate table. A mechanical vibration in the vertical direction of 60 nm MSD, which is typical at an edge die, may result in a deterioration in CD of 1.2 nm for a 70 nm isolated line, compared to center dies where a vibration of only 20 nm MSD might be present.

Accordingly, it would be advantageous, for example, to reduce or minimize deleterious effects of increased vibrations during exposure of certain areas of the substrate.

According to an aspect of the invention, there is provided a lithographic projection apparatus arranged to project a pattern from a patterning device onto a substrate, the apparatus comprising a substrate table configured to hold a substrate a positioning system configured to position the substrate table; a control system configured to control the positioning system to induce additional vibrations in the substrate table in a direction so that exposure of a plurality of areas of the substrate is performed under substantially uniform vibration conditions in that direction.

According to an aspect of the invention, there is provided a device manufacturing method, comprising:

projecting a patterned beam of radiation onto a substrate; and while projecting the patterned beam, inducing additional vibrations in the substrate in a direction whereby exposure of a plurality of areas of the substrate is performed under substantially uniform vibration conditions in that direction.

According to an aspect of the invention, there is provided a computer program product comprising program code that, when executed by a computer system forming part of a lithographic apparatus, instructs the computer system to control the apparatus to perform a device manufacturing method, the method comprising:

projecting a patterned beam of radiation onto a substrate;

while projecting the patterned beam, inducing additional vibrations in the substrate in a direction whereby exposure of a plurality of areas of the substrate is performed under substantially uniform vibration conditions in that direction.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
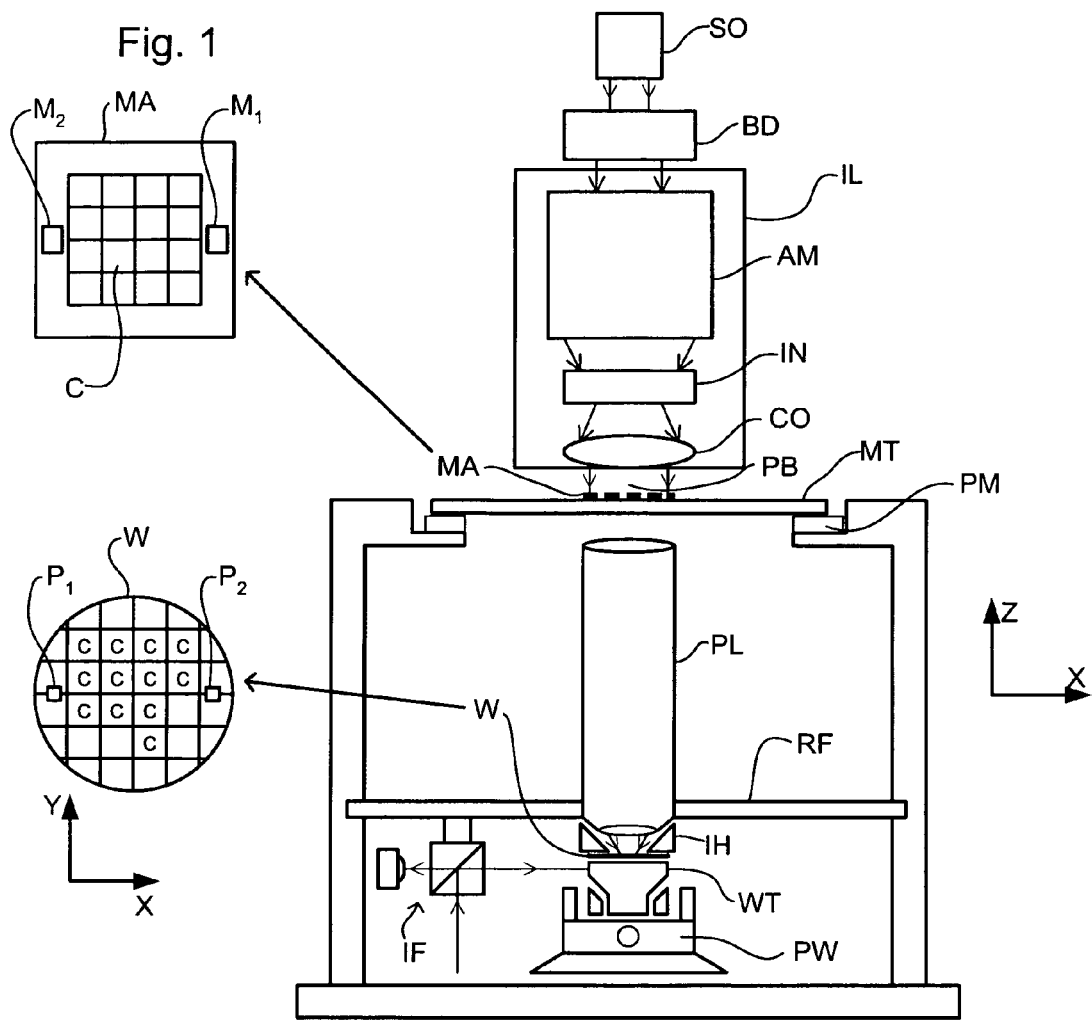
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam PB (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
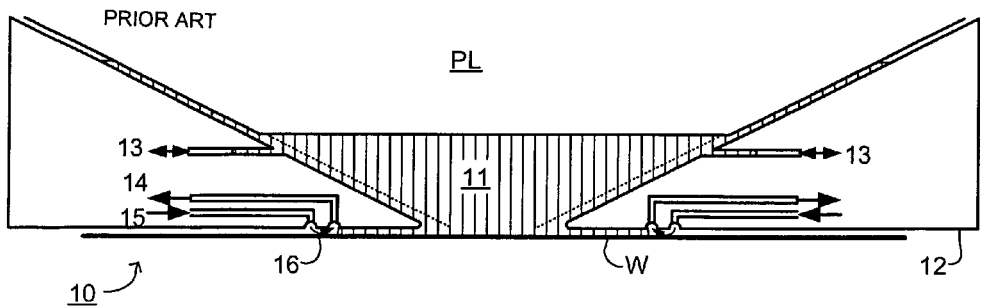
FIG. 5 depicts a further liquid supply system for use in a lithographic projection apparatus.

Another immersion lithography solution with a localized liquid supply system solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in United States patent application no. U.S. Ser. No. 10/705,783, hereby incorporated in its entirety by reference, and shown in FIG. 5.

A reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air or $N_2$ or an inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid.

Figure 6:
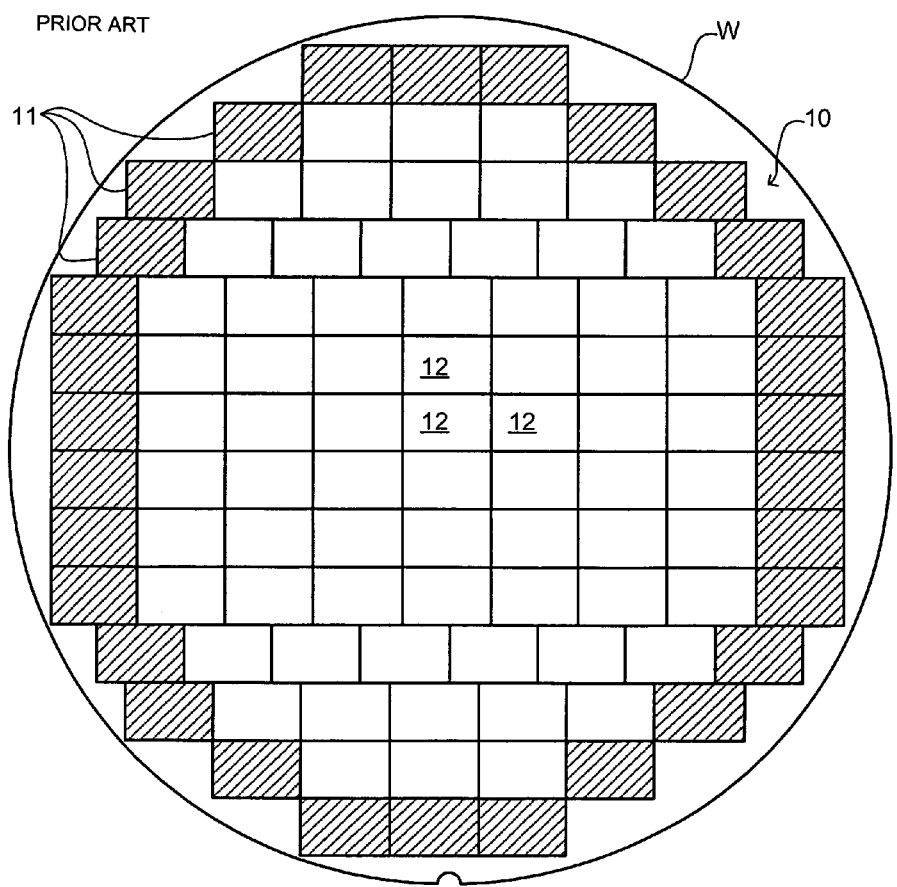
FIG. 6 depicts a substrate having a plurality of target portions thereon.

As shown in FIG. 6, a substrate W is covered with complete or partial devices by performing exposures of a plurality of target portions 10. (It should be noted that a target portion does not necessarily correspond to a device—in some cases, e.g. microprocessors, one device may be formed by several target portions while in other cases, e.g. memory devices, several devices may be contained in each target portion. A target portion is simply the region that is exposed in one exposure, scanned or static.) Some of these target portion 10 are adjacent the edge of the substrate and are referred to as edge target portions 11. In general, variations in the vertical position (height) of the upper surface of the substrate will be greater in the edge portions than in more central portions 12. During an exposure, especially a scanned exposure, the substrate table is moved to maintain the upper surface of the substrate as close as possible to the nominal plane of best focus of the aerial image. Greater variation in the substrate height in the edge portions 11 necessitates more substrate table movements, which inevitably cause more vibration. The additional vibration may blur the printed image and adversely affect critical dimension (CD). For example, if there are vibrations in the vertical (Z) direction of 60 nm MSD when exposing edge portions but only 20 nm MSD when exposing central portions, there may be a difference in CD between edge and central portions for a 70 nm isolated line of approximately 1.2 nm.

Figure 7:
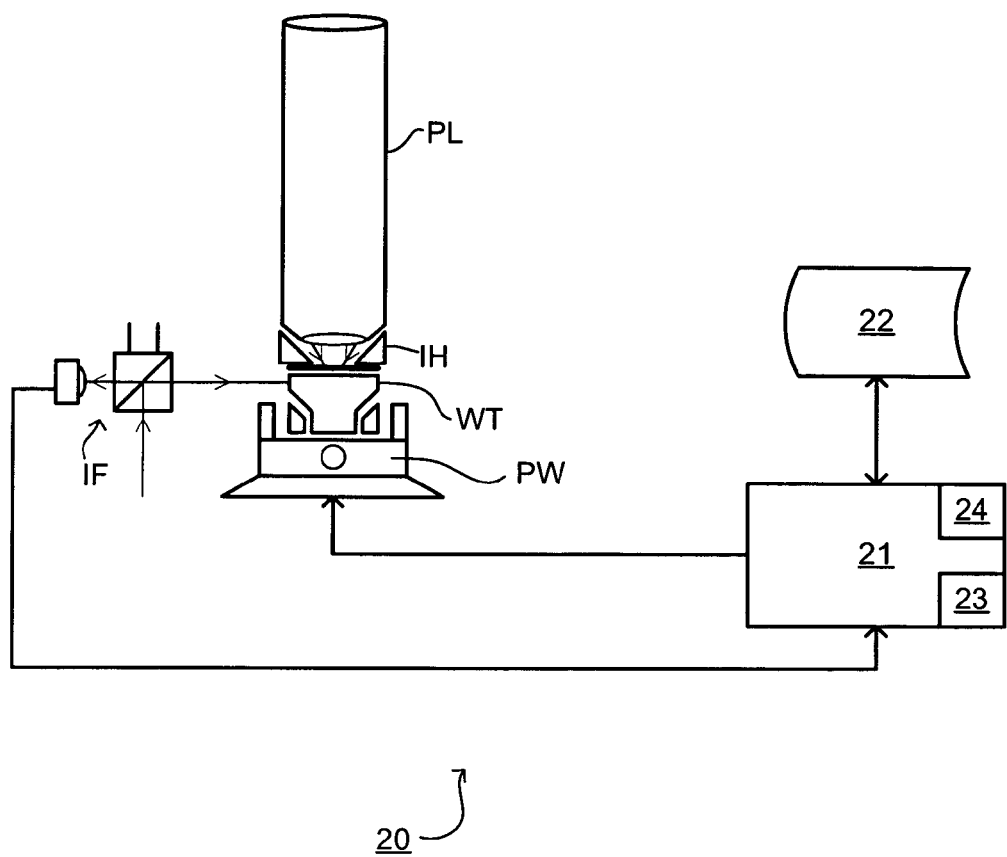
FIG. 7 depicts a control system according to an embodiment of the invention.

A control system 20 according to an embodiment of the invention is shown in FIG. 7. A controller 21 receives, from a storage device 22, a height map indicating the vertical positions of a plurality of points on the substrate and a plan indicating the order of exposure of the various target portions 10 on the substrate W. The controller 21 then calculates a trajectory for the substrate table to perform the exposures while maintaining the upper surface of the substrate as close as possible to the plane of best focus of the aerial image. The height map can be generated by known off-axis leveling procedures and the trajectory can be calculated from it by known algorithms.

According to this embodiment of the invention, the controller 21 includes a vibration prediction unit 23 which analyzes the calculated trajectory to determine the amplitude of vibrations in the substrate stage that will occur for each target portion when the trajectory is followed. This determination may be based on, for example, simulation or empirically derived rules, e.g. taking into account the number and/or size of vertical movements of the substrate in a given interval. Based on this information, a compensation calculator 24 calculates additional vibrations that should be superimposed on the calculated trajectory in target portions where there would otherwise be low levels of vibration so that substantially the same amplitude of vibrations is experienced during exposure of a plurality (e.g., many, most or all) of target areas. The controller 21 then controls the positioner PW to impose the additional vibrations on the calculated trajectory to result, for example, in a uniform effect on CD across the substrate and so improve CD uniformity.

In an embodiment of the invention, the additional vibrations may be added in only one direction, e.g. the Z direction (or a direction perpendicular to the upper surface of the substrate) or a direction substantially parallel to an upper surface of the substrate. In another embodiment, vibrations may be added in two or three substantially orthogonal directions. Rather than calculate the additional vibrations on the basis of a pre-measured height map, the vibrations may be added on the basis of a simple rule relating to the position of target portions or on the basis of measurements of the vibrations that have occurred in the exposure of previous target portions of the same substrate. It will be appreciated that rather than only adding vibrations during exposure of central target portions it may additionally or instead be possible to add vibrations to edge target portions.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate, the apparatus comprising:
   a substrate table configured to hold a substrate;
   a positioning system configured to move the substrate table for exposure of a plurality of target portions on the substrate;
   a control system configured to control the positioning system to net increase a level of vibration experienced by the substrate table in a direction during exposure of a target portion of the plurality of target portions to substantially equal a level of vibration experienced or expected to be experienced by the substrate table in the direction during exposure of another target portion of the plurality of target portions.

2. The apparatus according to claim 1, wherein exposure of the plurality of target portions of the substrate is performed under substantially uniform vibration conditions in the direction.

3. The apparatus according to claim 1, wherein the control system is configured to control the positioning system to increase the level of vibration experienced by the substrate table in a direction substantially perpendicular to the nominal upper surface of the substrate.

4. The apparatus according to claim 1, wherein the control system is configured to control the positioning system to increase the level of vibration experienced by the substrate table in a direction substantially parallel to the nominal upper surface of the substrate.

5. The apparatus according to claim 1, wherein the control system is configured to control the positioning system to increase the level of vibration experienced by the substrate table during exposure of a target portion of the plurality of target portions that is not adjacent to an edge of the substrate.

6. The apparatus according to claim 1, wherein the control system comprises a vibration prediction unit configured to predict vibrations that will occur during the course of a planned series of exposures and a compensation calculator configured to calculate additional vibrations that will increase the level of vibration experienced by the substrate table on the basis of the predicted vibrations.

7. The apparatus according to claim 6, wherein the vibration prediction unit is configured to predict the vibrations on the basis of a height map of a surface of the substrate.

8. The apparatus according to claim 1, further comprising a projection system configured to project the pattern onto the substrate and a liquid supply system configured to supply a liquid to a space between the projection system and the substrate.

9. A device manufacturing method, comprising:
projecting a patterned beam of radiation onto a substrate; and
while projecting the patterned beam, net increasing a level of vibration experienced by the substrate table in a direction during exposure of a target portion of a plurality of target portions on the substrate to substantially equal a level of vibration experienced or expected to be experienced by the substrate table in the direction during exposure of another target portion of the plurality of target portions.

10. The method according to claim 9, wherein exposure of the plurality of target portions of the substrate is performed under substantially uniform vibration conditions in the direction.

11. The method according to claim 9, comprising increasing the level of vibration experienced by the substrate in a direction substantially perpendicular to the nominal upper surface of the substrate.

12. The method according to claim 9, comprising increasing the level of vibration experienced by the substrate in a direction substantially parallel to the nominal upper surface of the substrate.

13. The method according to claim 9, comprising increasing the level of vibration experienced by the substrate during exposure of a target portion of the plurality of target portions that is not adjacent to an edge of the substrate.

14. The method according to claim 9, further comprising predicting vibrations that will occur during the course of a planned series of exposures and calculating an amount by which the level of vibration experienced by the substrate should be increased on the basis of the predicted vibrations.

15. The method according to claim 14, comprising predicting the vibrations on the basis of a height map of a surface of the substrate.

16. The method according to claim 9, further comprising supplying a liquid to a space between the substrate and a projection system used for projecting the patterned beam of radiation, and wherein projecting the patterned beam comprises projecting the patterned beam through the liquid onto the substrate.

17. A non-transitory computer program product comprising program code that, when executed by a computer system forming part of a lithographic apparatus, instructs the computer system to control the apparatus to perform a device manufacturing method, the method comprising:
projecting a patterned beam of radiation onto a substrate;
while projecting the patterned beam, net increasing a level of vibration experienced by the substrate table in a direction during exposure of a target portion of a plurality of target portions on the substrate to substantially equal a level of vibration experienced or expected to be experienced by the substrate table in the direction during exposure of another target portion of the plurality of target portions.

18. The computer program product according to claim 17, wherein exposure of the, plurality of target portions of the substrate is performed under substantially uniform vibration conditions in the direction.

19. The computer program product according to claim 17, wherein the method comprises increasing the level of vibration experienced by the substrate in a direction substantially perpendicular to the nominal upper surface of the substrate.

20. The computer program product according to claim 17, wherein the method comprises increasing the level of vibration experienced by the substrate in a direction substantially parallel to the nominal upper surface of the substrate.

21. The computer program product according to claim 17, wherein the method comprises increasing the level of vibration experienced by the substrate during exposure of a target portion of the plurality of target portions that is not adjacent to an edge of the substrate.

22. The computer program product according to claim 17, wherein the method further comprises predicting vibrations that will occur during the course of a planned series of exposures and calculating an amount by which the level of vibration experienced by the substrate should be increased on the basis of the predicted vibrations.

23. The computer program product according to claim 22, wherein the method comprises predicting the vibrations on the basis of a height map of a surface of the substrate.

* * * * *